(12) United States Patent
Crosman, III et al.

(10) Patent No.: US 9,625,512 B2
(45) Date of Patent: Apr. 18, 2017

(54) DETECTING GROUND FAULT LOCATION (71) Applicant: Caterpillar Inc., Peoria, IL (US)

(72) Inventors: Alexander C. Crosman, III, Dunlap, IL (US); Ernesto Inoa, Dunlap, IL (US); Jesse R. Gerdes, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 579 days.

(21) Appl. No.: 14/150,119

(22) Filed: Jan. 8, 2014

(65) Prior Publication Data

US 2015/0192632 A1 Jul. 9, 2015

(51) Int. Cl.
*G01R 31/08* (2006.01)
*G01R 31/34* (2006.01)
*G01R 31/02* (2006.01)

(52) U.S. Cl.
CPC ......... *G01R 31/025* (2013.01); *G01R 31/343* (2013.01); *G01R 31/086* (2013.01)

(58) Field of Classification Search
CPC .... G01R 31/14; G01R 31/025; G01R 31/343; G01R 31/086; G01R 27/18; G05F 1/565; G05F 1/569; G05F 1/571; G05F 1/575; H01L 23/62; H02J 7/0039
See application file for complete search history.

(56) References Cited

U.S. PATENT DOCUMENTS

| | | | |
|---|---|---|---|
| 5,910,892 A | 6/1999 | Lyons et al. | |
| 6,794,879 B2 * | 9/2004 | Lawson | G01R 27/18 324/509 |
| 7,019,486 B1 | 3/2006 | Kifuku et al. | |
| 7,498,820 B2 * | 3/2009 | Kumar | B60L 3/0023 324/509 |
| 7,529,069 B1 * | 5/2009 | Weems, II | G01R 31/025 361/42 |
| 7,978,446 B2 | 7/2011 | Lindsey | |
| 8,013,612 B2 | 9/2011 | Morini et al. | |
| 2003/0155928 A1 | 8/2003 | Roden et al. | |
| 2009/0102488 A1 | 4/2009 | Morini et al. | |
| 2010/0244760 A1 * | 9/2010 | Anwar | G01R 31/025 318/490 |
| 2012/0086459 A1 * | 4/2012 | Kim | G01R 29/18 324/522 |
| 2012/0112757 A1 | 5/2012 | Vrankovic et al. | |
| 2014/0167779 A1 * | 6/2014 | Si | G01R 31/42 324/509 |

FOREIGN PATENT DOCUMENTS

| | | |
|---|---|---|
| JP | 07209366 | 8/1995 |
| JP | 2009022100 | 1/2009 |

* cited by examiner

*Primary Examiner* — Jermele M Hollington
*Assistant Examiner* — Suresh K Rajaputra
(74) *Attorney, Agent, or Firm* — Miller, Matthias & Hull (57) ABSTRACT

A technique and system for detecting a location of a ground fault in an electrical system are provided. The technique and system include steps or components for determining a ground fault voltage, receiving a gate control signal associated with an electric load, comparing the ground fault voltage to the gate control signal, and determining whether the ground fault is located at the electric load based on the comparison of the ground fault voltage to the gate control signal.

20 Claims, 5 Drawing Sheets

DETECTING GROUND FAULT LOCATION

FIELD OF THE DISCLOSURE

The present disclosure relates generally to electric machines and, more particularly, to ground fault detection systems and methods.

BACKGROUND OF THE DISCLOSURE

Due to higher efficiency and lower maintenance requirements, electric or hybrid machines may be used as alternatives to their fuel powered counterparts in industrial applications. Such electric or hybrid machines include, but are not limited to, mining, construction, earth-moving, industrial or agricultural machines with electric drive systems. An electric drive system in this context employs electric motors and associated electrical components to drive the machine. The electric drive system is typically coupled to an electrical power source, such as a generator, which provides electrical power for driving the electric loads of the machine. For example, the electric motors receive electrical power from the power source and convert that power into mechanical energy in order to perform tasks associated with the machine.

However, it is sometimes possible for electric current associated with the components of the electric drive system to leak to ground via a machine frame and cause a ground fault. Significant leakage currents may be indicative of machine component fatigue or a failure in insulation or insulators associated with the electrical system. Therefore, detection of ground faults may aid in maintaining the electric drive machine and ensuring continued efficient operation.

It is known to perform ground fault detection with respect to electrical systems. For example, U.S. Pat. No. 7,978,446, entitled, "High Voltage Ground Fault Detection System" and assigned to Caterpillar Inc., describes such a system. The system of the '446 patent is designed to detect a ground fault on an electrical component, such as an isolated electrical component. The system of the '446 patent also offers local protection functions in the event of data communication failure.

The present disclosure is directed to a system and method to determine a location of the ground fault. However, it should be appreciated that the solution of any particular problem is not a limitation on the scope of this disclosure or of the attached claims except to the extent expressly noted herein. Additionally, this background section discusses problems and solutions noted by the inventors; the inclusion of any problem or solution in this section is not an indication that the problem or solution represents known prior art except that that the contents of the indicated patent represent a publication. With respect to the identified patent, the foregoing summary thereof is not intended to alter or supplement the prior art document itself; any discrepancy or difference should be resolved by reference to the document itself.

SUMMARY OF THE DISCLOSURE

In accordance with one aspect of the present disclosure, a method is provided for detecting a location of a ground fault in an electrical system including an electrical load. In this aspect, the method entails determining a ground fault voltage representative of a voltage across a resistor that indicates presence of the ground fault in the electrical system, receiving a gate control signal associated with the electric load, comparing the ground fault voltage to the gate control signal, and determining whether the ground fault is located at the electric load based on the comparison of the ground fault voltage to the gate control signal.

In accordance with another aspect of the present disclosure, a ground fault detection system for an electrical system is provided. The ground fault detection system in this aspect comprises a ground fault location module. The ground fault location module is configured in this aspect to receive a ground fault voltage signal indicative of a ground fault in the electrical system, and to receive a first gate control signal associated with a first load. The ground fault location module in this aspect is further configured to determine a first degree of correlation between the ground fault voltage signal and the first gate control signal. The ground fault location module determines whether a location of the ground fault is associated with the first load based on the first degree of correlation between the ground fault voltage signal and the first gate control signal.

In accordance with yet another aspect of the present disclosure, a machine is provided. In accordance with this further aspect, the machine includes an electrical system, a controller, and a ground fault detection system. The electrical system in this aspect includes a first motor and a second motor. The controller is operatively connected to the electrical system, and is configured to send gate control signals to the electrical system to control the first and second motors. The ground fault detection system may be operatively connected to the electrical system and the controller. The ground fault detection system generates a ground fault voltage signal indicative of a ground fault present in the electrical system, receives the gate control signals from the controller, and determines a location of the ground fault in at least one of the first motor and the second motor based on a comparison of the ground fault voltage signal to the gate control signals.

These and other aspects and features will become more readily apparent upon reading the following detailed description taken in conjunction with the accompanying drawings.

Although various features are disclosed in relation to specific exemplary embodiments, it is understood that the various features may be combined with each other, or used alone, with any of the various exemplary embodiments without departing from the scope of the disclosure.

While the present disclosure is susceptible to various modifications and alternative constructions, certain illustrative embodiments thereof will be shown and described below in detail. The disclosure is not limited to the specific embodiments disclosed, but instead includes all modifications, alternative constructions, and equivalents thereof.

DETAILED DESCRIPTION

The present disclosure provides a system and method for determining a location of a ground fault in an electrical system of a machine. In particular, the disclosed system and method correlate a ground fault voltage with gate control signals in order to locate the ground fault. By determining a location of the ground fault, the repair time may be minimized and the repair process to repair the ground fault may be simplified.

Reference will now be made in detail to specific embodiments or features, examples of which are illustrated in the accompanying drawings. Generally, corresponding reference numbers will be used throughout the drawings to refer to the same or corresponding parts.

Figure 1:
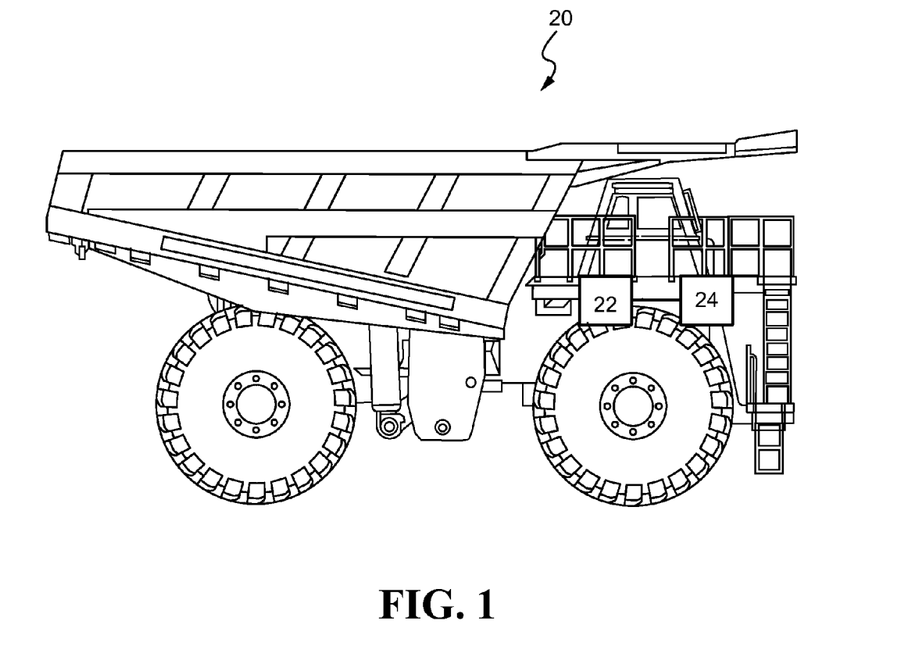
FIG. 1 is a perspective view of a machine according to an example embodiment of the present disclosure.

FIG. 1 illustrates an exemplary machine 20 consistent with certain disclosed embodiments. It is to be understood that although the machine 20 is illustrated as a mining truck, the machine may be of any other type. As used herein, the term "machine" refers to a fixed or mobile machine that performs a driven operation involving physical movement associated with a particular industry, such as, without limitation, mining, construction, agriculture, transportation, etc.

A non-limiting example of a fixed machine is an engine system operating in a plant or off-shore environment (e.g., an off-shore drilling platform). Non-limiting examples of mobile machines include commercial and industrial machines, such as trucks, locomotives, cranes, earth-moving vehicles, mining vehicles, backhoes, material handling equipment, agricultural equipment, marine vessels, on-highway vehicles, or other types of movable machines that operate in a work environment. It is also to be understood that the machine 20 is shown primarily for illustrative purposes to assist in disclosing features of various embodiments, and that FIG. 1 does not depict all of the components of an exemplary machine.

Machine 20 includes an electrical system 22 operatively connected to a ground fault detection system 24. For example, the electrical system 22 may be an electric drive system for driving the machine 20. As shown best in FIG. 2, the electrical system 22 may include a power source 26 operatively connected to a first electric load 28 and a second electric load 30. It is to be understood that more or fewer electric loads may be used in the electrical system 22.

Figure 2:
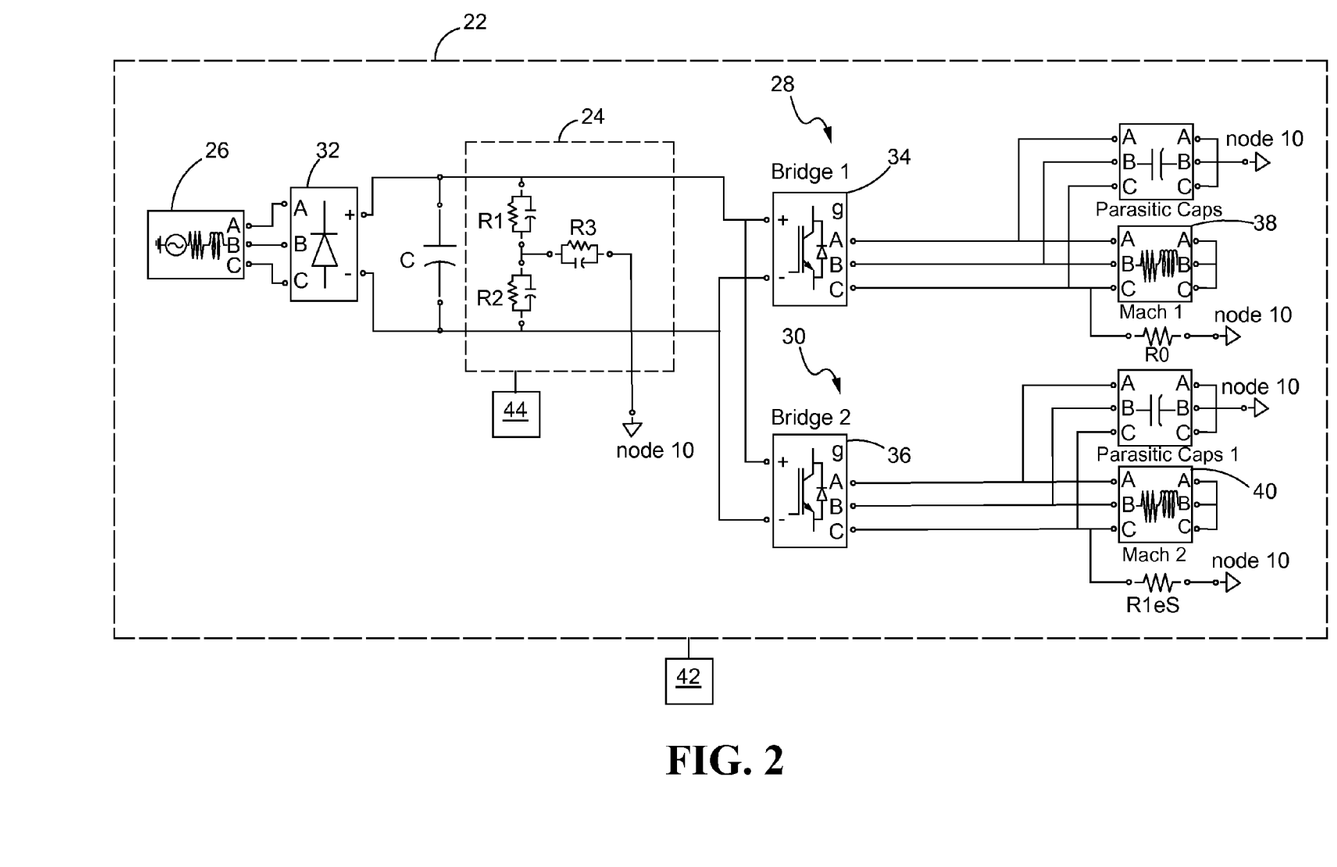
FIG. 2 is a schematic representation of an electrical system including a ground fault detection system according to another embodiment of the present disclosure.

The power source 26 may comprise a generator or any other suitable device for providing an electrical power output (e.g., a battery, a fuel cell, or other type of power source configured to provide electrical power to the machine 20). Furthermore, the electrical system 22 may include one or more power converters configured to convert power provided by the power source 26 into electrical power forms appropriate for consumption by the electric loads 28, 30. For example, the electrical system 22 may include a rectifier 32 associated with the power source 26, a first inverter 34 associated with the first load 28, and a second inverter 36 associated with the second load 30.

Each of the loads 28, 30 may comprise an electric motor, such as, without limitation, an alternating current (AC) induction motor, a brushless direct current (DC) motor, a variable or switched reluctance motor, a stepper motor, a linear motor, or any other type of motor. For example, the first load 28 may include a first electric motor 38, and the second load 30 may include a second electric motor 40. The electric motors 38, 40 convert at least a portion of the electrical power output into mechanical energy in order to perform tasks associated with the machine 20. It is to be understood that more or fewer motors 38, 40 may be used. In addition, other types of electric loads 28, 30 may supplement or replace the electric motors 38, 40 in a given implementation.

A controller 42 is operatively connected to the electrical system 22 in order to control the electric loads 28, 30. The controller 42 is a processor (e.g., "computer processor") or processor-based device that may include or be associated with a non-transitory computer readable storage medium having stored thereon computer-executable instructions. For example, the controller 42 may include a microcontroller for controlling the electric motors 38, 40 via the inverters 34, 36.

Operatively connected to the electrical system 22 and the controller 42, the ground fault detection system 24 is configured to detect ground faults, if any, in the electrical system 22. The ground fault detection system 24 may be included as an integral part of the electrical system 22 and the controller 42. Alternatively, the ground fault detection system 24 may also be external to the electrical system 22 and the controller 36.

In the embodiment illustrated in FIG. 2, the ground fault detection system 24 monitors a voltage across resistor R3, referred to as ground fault voltage $V_{R3}$. During normal operation, the ground fault voltage $V_{R3}$ is a result of parasitic currents flowing to ground through cable insulation. The parasitic currents are generally small and as such do not typically create a significant voltage drop across resistor R3. However, if a ground fault exists in the electrical system 22, the ground fault voltage $V_{R3}$ will be of a significant non-zero magnitude. A ground fault voltage signal indicative of the ground fault voltage $V_{R3}$ or of a ground fault present in the electrical system 22 is generated by the ground fault detection system 24 and is sent to the controller 42. It is to be understood given the teachings disclosed herein that alternative configurations and methods may be used to detect ground faults in the electrical system 22.

Moreover, a magnitude and wave shape of the ground fault voltage $V_{R3}$ may be used to determine a severity of the ground fault, as well as an indication of a location of the ground fault in the electrical system 22. For example, if the ground fault voltage $V_{R3}$ has a significant AC component, the ground fault may be located in one of the first or second loads 28, 30 or respective branches. If the ground fault voltage $V_{R3}$ has a significant DC component, the ground fault may be located in a DC bus.

In an embodiment, in order to determine a precise location of the ground fault in the loads 28, 30, the ground fault detection system 24 utilizes information associated with the ground fault voltage $V_{R3}$ together with gate control signals from the controller 42. More specifically, the ground fault detection system may include a ground fault location module 44. For example, the location module 44 may be programmed into the controller 42 of the electrical system 22 or ground fault detection system 24. The location module 44 receives the ground fault voltage signal indicative of the ground fault voltage $V_{R3}$ or of the presence of a ground fault in the electrical system 22.

The location module 44 may also receive gate control signals, which are signals generated by the controller 42 to control the first and second motors 38, 40. The controller 42 may operatively send the gate control signals to the inverters 34, 36 in order to control the power delivered to the motors 38, 40. Each of the first and second motors 38, 40 may have a plurality of phase terminals A, B, and C for each phase of power (e.g., for three-phase power). The controller 42 generates a gate control signal for each phase terminal A, B, and C for each motor 38, 40. For example, the controller 42 may generate six gate control signals in total, including three for each motor. The location module 44 receives the gate control signals from the controller 42 for correlation of the signals to the ground fault voltage $V_{R3}$.

Referring now to FIGS. 3-7, with continued reference to FIGS. 1 and 2, the location module 44 compares the ground fault voltage signal 46 to each gate control signal in an embodiment in order to determine a degree of correlation between the ground fault voltage $V_{R3}$ and each of the gate control signals. When there is a ground fault present in the electrical system 22, the ground fault voltage $V_{R3}$ will have a high degree of correlation with the gate control signal of the phase terminal in the motor where the ground fault occurred. Conversely, in the phase terminals of the motors where the ground fault did not occur, the respective gate signals will not exhibit a high degree of correlation with the ground fault voltage $V_{R3}$.

Figure 3:
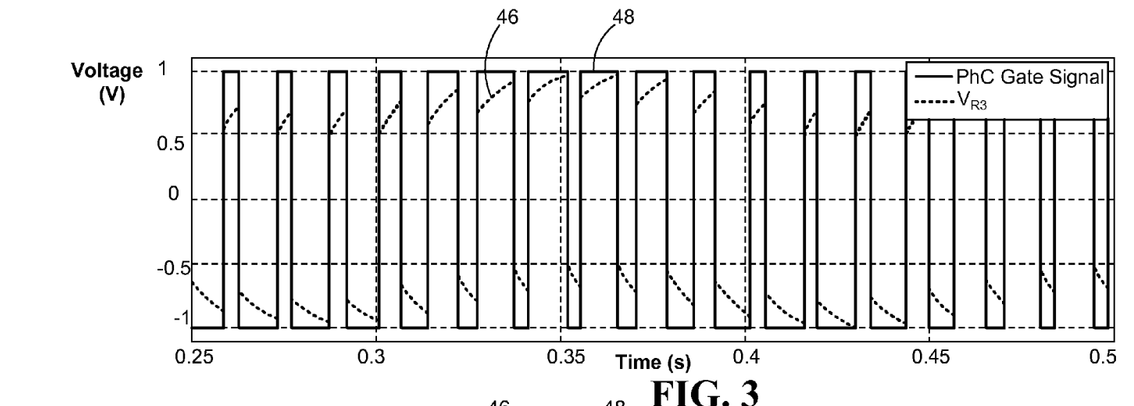
FIG. 3 is a graph depicting a ground fault voltage and a gate control signal with a ground fault located at a phase terminal associated with the gate control signal according to another exemplary embodiment of the present disclosure.

For example, as shown best in the waveforms of FIG. 3, when a ground fault occurs at a phase terminal of either motor 38, 40, the gate control signal 48 for that phase terminal is highly correlated to the ground fault voltage signal 46. Gate control signal 48 may be representative of any one of the gate control signals of either one of the loads 28, 30 (e.g., phase terminals A, B, and C of first motor 38 and second motor 40). If there is a ground fault at the phase terminal of a motor, when the gate control signal 48 for that phase terminal is positive, the ground fault voltage signal 46 is positive and increasing. Similarly, when the gate control signal 48 for that phase terminal is negative, the ground fault voltage signal 46 is negative and decreasing. With both signals 46, 48 being positive at the same time and negative at the same time, there is a high degree of correlation between the gate control signal 48 of the phase terminal where the ground fault occurred and the ground fault voltage signal 46, thereby indicating the precise location of the ground fault.

Figure 4:
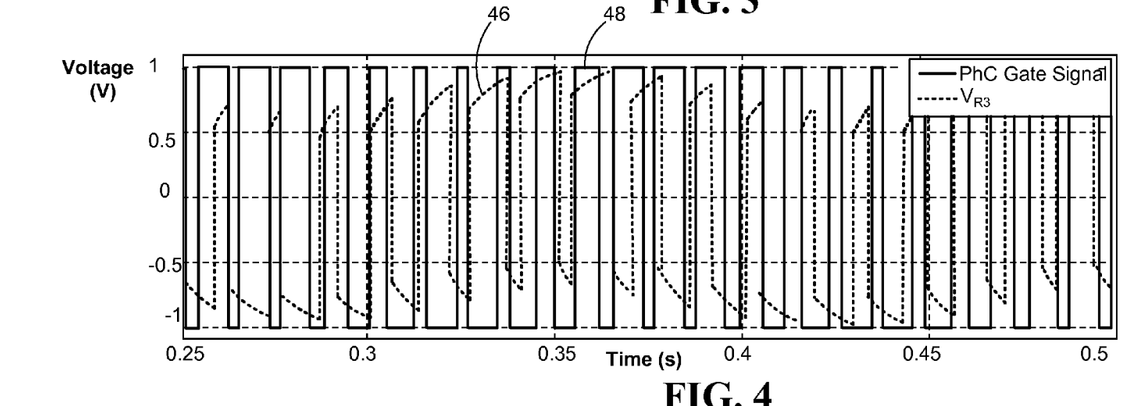
FIG. 4 is a graph depicting a ground fault voltage and a gate control signal with a ground fault located at a different phase terminal than the phase terminal associated with the gate control signal according to another embodiment of the present disclosure.

FIG. 4 illustrates waveforms of the gate control signal 48 and the ground fault voltage signal 46 that may occur when the ground fault is not located at the phase terminal associated with the gate control signal 48. If there is a ground fault, but the ground fault is not located at the phase terminal of the gate control signal 48, the ground fault voltage signal 46 and the gate control signal 48 will not be highly correlated. The signals 46, 48 are not positive and negative simultaneously (as that illustrated in FIG. 3). Although the ground fault voltage signal 46 is the same as that shown in FIG. 3, the gate control signal 48 is not the same as that shown in FIG. 3. Therefore, there is not a high degree of correlation between the ground fault voltage signal 46 and the gate control signal 48 of the phase terminal where the ground fault is not located, thereby indicating an absence of a ground fault at that phase terminal.

Accordingly, the location module 44 may detect the location of the ground fault in the electrical system 22 via a comparison of the ground fault voltage $V_{R3}$ to each of the gate control signals. By determining which gate control signal (e.g., out of the six gate control signals sent to the phase terminals A, B, and C of the first and second motors 38, 40) has a high correlation with the ground fault voltage $V_{R3}$ or voltage signal 46, the location module 44 may determine a precise location of the ground fault. More specifically, the location module 44 can detect at which motor 38, 40 and at which phase terminal A, B or C the ground fault occurred. It is to be understood that the location module 44 may be configured to detect the location of one or more ground faults in one or more phase terminals of one or more motors at the same or different times.

The comparison of the ground fault voltage $V_{R3}$ to each of the gate control signals in the location module 44 and a determination of a degree of correlation between the same may be implemented by way of various processes, such as, without limitation, a low-pass filtering process 50, a triggered derivative process 60, and a zero-crossing process 70. For example, the low-pass filtering process 50 may include a low-pass filter 52 applied to the ground fault voltage signal 46, as shown best in FIG. 5. At module 54, a slope of the ground fault voltage signal may be determined through differentiation (e.g., a first-order derivative). At module 56, the slope of the ground fault voltage signal is compared to the gate control signal 48, e.g., through an exclusive-NOR gate. A second low-pass filter 58 is applied to an output of module 56, or to a signal indicative of the comparison of the ground fault voltage signal 46 and the gate control signal 48.

Figure 5:
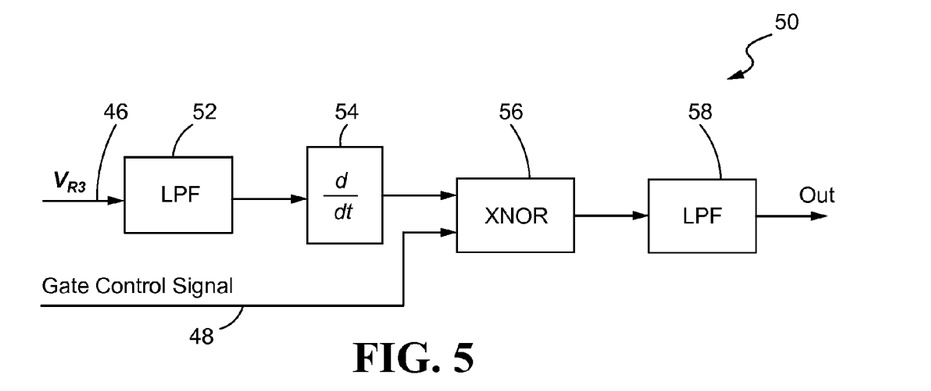
FIG. 5 is a schematic representation of a low-pass filtering process according to another embodiment of the present disclosure.

Low-pass filters 52, 58 remove short-term (rapidly changing) fluctuations, thereby providing smoother signals. Furthermore, the second low-pass filter 58 may compensate for the delay introduced by the filtering process of the first filter 52. It is to be understood that the implementation of the comparison of the ground fault voltage $V_{R3}$ to each of the gate control signals may utilize more or fewer filters, including no filters at all.

Figure 6:
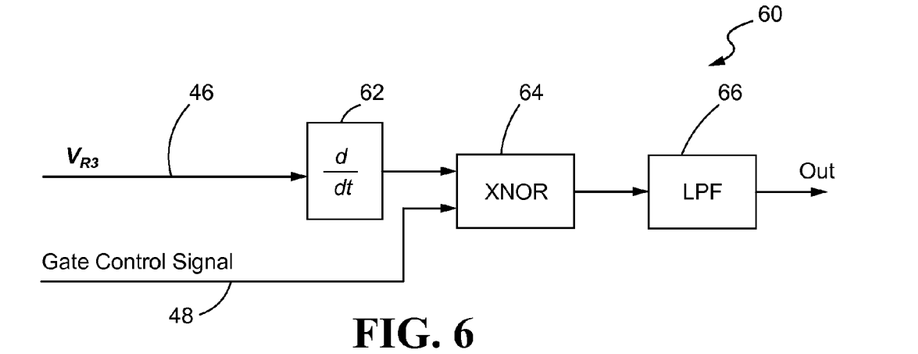
FIG. 6 is a schematic representation of a triggered derivative process according to another embodiment of the present disclosure.

In another example, a triggered derivative process 60, shown best in FIG. 6, obtains the slope of the ground voltage signal 46 at predetermined points in time. At module 62, the ground fault voltage signal 46 is sampled only in instances when the gate control signal 48 changes, such as from low to high or high to low. Therefore, the derivative or slope of the ground fault voltage $V_{R3}$ may be triggered by a gate control signal 48 change, with module 62 not determining the slope of every sample of the ground fault voltage signal 46. At module 64, the slope of the ground fault voltage signal is compared to the gate control signal 48, such as, through an exclusive-NOR gate. In addition, a low-pass filter 66 may be applied to an output of module 64.

Figure 7:
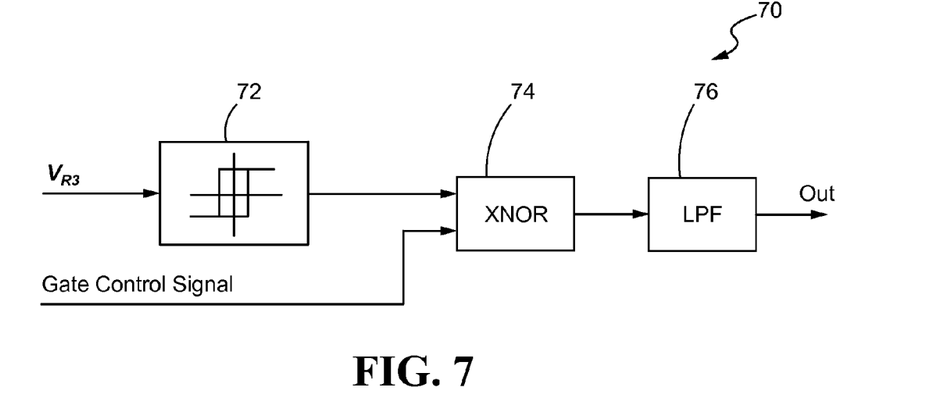
FIG. 7 is a schematic representation of a zero-crossing process according to another embodiment of the present disclosure.

In yet another example, a zero-crossing process 70, shown best in FIG. 7, compares a sign or polarity of the ground fault voltage signal 46 to the gate control signal 48. At module 72, the polarity of the ground fault voltage $V_{R3}$ may be determined, such as through zero-crossing with hysteresis to prevent oscillations. At module 74, the polarity of the ground fault voltage signal is compared to the gate control signal 48, such as, through an exclusive-NOR gate. In addition, a low-pass filter 76 may be applied to an output of module 74.

It is to be understood that more or fewer filters than that shown and described in FIGS. 5-7, may be applicable to the location module 44 of the ground fault detection system 24.

Alternatively, there may be no filtering applied to the processes 50, 60, and 70. Furthermore, FIGS. 5-7 are only graphical depictions of processes 50, 60, and 70, and are not limited to the specific gates and modules shown and described. Other components may be used to implement the same processes and modify the processes without departing from the scope of the present disclosure. Processes 50, 60, and 70 may be algorithms programmed into or associated with the location module 44 of the ground fault detection system 24 or controller 42 of the electrical system 22.

Other processes may be used to determine a correlation between the ground fault voltage $V_{R3}$ and gate control signals. For example, multiplication may be applied to the signals 46, 48, such as, by way of a multiplier, equivalent logic gates, and/or related algorithms. For example, a Fast-Fourier Transform (FFT) may be applied on the ground fault voltage to extract frequency information. The location of the ground fault may be estimated by correlating the extracted frequency information to the motor frequencies.

INDUSTRIAL APPLICABILITY

In general, the foregoing disclosure finds utility in various industrial applications, such as in mining, construction, earthmoving, industrial, agricultural, and transportation machines. In particular, the disclosed fault detection system and method may be applied to large mining trucks or locomotives, as well as any fixed machine (which may include an engine system operating in a plant or off-shore environment, e.g., off-shore drilling platform) or mobile machine (e.g., truck, locomotive, crane, earth-moving vehicle, mining vehicle, backhoe, material handling equipment, agricultural equipment, marine vessel, on-highway vehicle, or any other type of movable machine that operates in a work environment) having an electrical system.

By applying the disclosed system and method to a machine, the location of a ground fault in the electrical system may be determined. In particular, the disclosed system and method correlate the ground fault voltage with the different gate control signals that control the motor inverters in order to determine which motor phase terminal is responsible for the ground fault. Furthermore, by locating the specific motor and phase terminal of the motor where the ground fault occurred, the repair process is simplified and shortened. In so doing, a cost savings benefit is achieved. In addition, the disclosed system and method may be performed in real-time while the machine is operating or when it is stopped.

Figure 8:
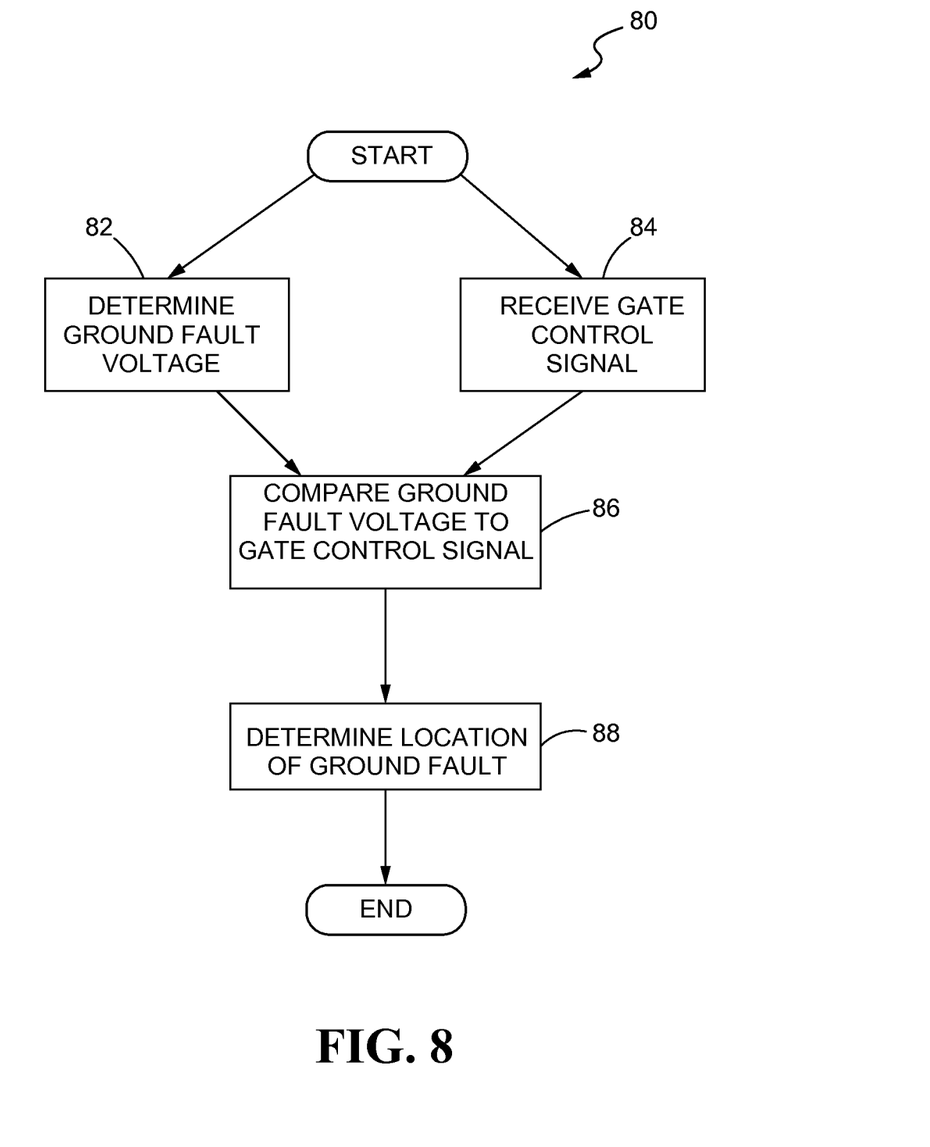
FIG. 8 is a flowchart illustrating a process for detecting a location of a ground fault in an electrical system according to another embodiment of the present disclosure.

Turning now to FIG. 8, a flowchart outlining a process 80 for detecting a location of a ground fault in an electrical system is shown, according to another embodiment of the present disclosure. At a block 82, the ground fault voltage is determined, and at a block 84, the gate control signal associated with a phase terminal of the electric load is received. The ground fault voltage is compared to the gate control signal at block 86. For example, a degree of correlation between the ground fault voltage and the gate control signal may be determined. At block 88, based on the comparison of the ground fault voltage to the gate control signal, the location of the ground fault is determined. For example, if there is a high degree of correlation between the ground fault voltage and the gate control signal, then the ground fault is located at the phase terminal of the electric load with which the gate control signal is associated. If there is not a high degree of correlation between the ground fault voltage and the gate control signal, then the ground fault is not located at the phase terminal of the electric load.

Moreover, the determined degree of correlation between the ground fault voltage and the gate control signal may be compared to a first threshold. The first threshold may be a predetermined degree of correlation signifying an amount of similarity between the ground fault voltage and the gate control signal (e.g., the ground fault voltage and the gate control signal having the same polarity at the same times.) If the degree of correlation meets the first threshold, then the ground fault is located at the phase terminal of the electric load with which the gate control signal is associated. If the degree of correlation does not meet the first threshold, then the ground fault is not located at the phase terminal of the electric load.

The process 80 may be performed on each gate control signal associated with each phase terminal of the motors or loads in the electrical system. For example, the degrees of correlation of the ground fault voltage with each of the gate control signals may be compared with each other to determine which gate control signal (of the same or different motor) has the highest degree of correlation with the ground fault voltage. The gate control signal with the highest degree of correlation indicates the specific phase terminal of the particular motor that is responsible for the ground fault. Moreover, the degrees of correlation may each be compared with the first threshold and/or other thresholds in order to determine which gate control signal is most highly correlated to the ground fault voltage.

In this way, the precise location of the ground fault can be determined. For example, the location of the ground fault can be isolated to a specific phase terminal A, B, or C of a particular motor (first motor or second motor) or load (first load or second load). Furthermore, the comparison of the ground fault voltage with each of the gate control signals may be performed simultaneously. In addition, more than one ground fault location may be isolated at the same or different time.

It will be understood that the flowchart in FIG. 8 is shown and described for example purposes only to assist in disclosing the features of the system and that more or fewer steps in a the same or different order than that shown may be included in the method 80 without departing from the scope of the present disclosure.

While the foregoing detailed description has been given and provided with respect to certain specific embodiments, it is to be understood that the scope of the disclosure should not be limited to such embodiments, but that the same are provided simply for enablement purposes. The breadth and spirit of the present disclosure are broader than the embodiments specifically disclosed and are limited only by the claims appended hereto.

While some features are described in conjunction with specific embodiments, these features are not limited to use with only the embodiment with which they are described, but instead may be used together with or separate from, other features disclosed in conjunction with alternate embodiments.

What is claimed is:

1. A method for detecting a location of a ground fault in an electrical system including an electric load, the method comprising:
   determining a ground fault voltage representative of a voltage across a resistor which indicates presence of the ground fault in the electrical system;
   receiving a gate control signal generated by a controller in order to control a power delivered to the electric load;
   comparing a polarity of the ground fault voltage to a polarity of the gate control signal; and determining whether the ground fault is located at the electric load based on the comparison of the ground fault voltage to the gate control signal.

2. The method of claim 1, wherein determining whether the ground fault is located at the electric load based on the comparison of the ground fault voltage to the gate control signal includes determining a degree of correlation between the ground fault voltage and the gate control signal.

3. The method of claim 2, wherein determining whether the ground fault is located at the electric load comprises determining the location of the ground fault to be at the electric load if the degree of correlation between the ground fault voltage and the gate control signal meets a first threshold.

4. The method of claim 1, further comprising applying a first low-pass filter to the ground fault voltage.

5. The method of claim 4, further comprising applying a second low-pass filter to a signal indicative of the comparison of the ground fault voltage to the gate control signal in order to remove short-term signal fluctuations.

6. The method of claim 1, further comprising determining a slope of the ground fault voltage, and determining a location of the ground fault based at least in part on a comparison of the slope of the ground fault voltage to the gate control signal.

7. The method of claim 6, further comprising determining the slope of the ground fault voltage when the gate control signal changes from low to high or high to low.

8. The method of claim 1, further comprising determining the polarity of the ground fault voltage.

9. A ground fault detection system for an electrical system, the ground fault detection system comprising:
a ground fault location module configured to:
receive a ground fault voltage signal indicative of a ground fault in the electrical system, and a first gate control signal generated by a controller in order to control a power delivered to a first load,
determine a first degree of correlation between the ground fault voltage signal and the first gate control signal based on a comparison of a polarity of the ground fault voltage signal to a polarity of the first gate control signal, and
determine whether a location of the ground fault is associated with the first load based on the first degree of correlation between the ground fault voltage signal and the first gate control signal.

10. The ground fault detection system of claim 9, wherein the ground fault location module is further configured to determine a slope of the ground fault voltage signal through differentiation, and compare the slope of the ground fault voltage signal to the first gate control signal to determine the location of the ground fault.

11. The ground fault detection system of claim 10, wherein the ground fault location module is further configured to determine the slope of the ground fault voltage when the first gate control signal changes.

12. The ground fault detection system of claim 9, wherein the ground fault location module is further configured to determine the polarity of the ground fault voltage signal through zero-crossing, and compare the polarity of the ground fault voltage signal to the first gate control signal to determine the first degree of correlation between the ground fault voltage signal and the first gate control signal.

13. The ground fault detection system of claim 9, wherein the first gate control signal is associated with a first terminal of the first load, and wherein the ground fault location module is further configured to:
receive a second gate control signal associated with a second terminal of the first load,
determine a second degree of correlation between the ground fault voltage signal and the second gate control signal, and
determine whether a location of the ground fault is associated with the first terminal or the second terminal of the first load based on the first and second degrees of correlation.

14. The ground fault detection system of claim 9, wherein the ground fault location module is further configured to:
receive a second gate control signal associated with a second load,
determine a second degree of correlation between the ground fault voltage signal and the second gate control signal, and
determine whether a location of the ground fault is associated with the second load based on the second degree of correlation.

15. A machine, comprising:
an electrical system having a first motor and a second motor;
a controller operatively connected to the electrical system, the controller configured to generate and send gate control signals to the electrical system to control a power delivered to the first and second motors; and
a ground fault detection system operatively connected to the electrical system and the controller, the ground fault detection system configured to:
generate a ground fault voltage signal indicative of a ground fault present in the electrical system,
receive the gate control signals from the controller, and
determine a location of the ground fault in at least one of the first motor or the second motor based on a comparison of a polarity of the ground fault voltage signal to a polarity of each of the gate control signals.

16. The machine of claim 15, wherein the ground fault detection system is further configured to determine a slope of the ground fault voltage signal.

17. The machine of claim 16, wherein the ground fault detection system is further configured to determine the location of the ground fault based on a comparison of the slope of the ground fault voltage signal to the gate control signals.

18. The machine of claim 15, wherein the ground fault detection system is further configured to determine the polarity of the ground fault voltage signal.

19. The machine of claim 18, wherein the ground fault detection system is further configured to determine the location of the ground fault based on a comparison of the polarity of the ground fault voltage signal to the gate control signals.

20. The machine of claim 15, wherein each of the first and second motors has a plurality of terminals, and wherein the ground fault detection system is further configured to determine the location of the ground fault in at least one of the plurality of terminals of the first and second motors.

* * * * *